United States Patent [19]

Tester

[11] 4,340,786
[45] Jul. 20, 1982

[54] PIEZO-ELECTRIC FILM MANUFACTURE

[76] Inventor: Norman W. Tester, 25 Sakins Croft, Harlow, Essex, England

[21] Appl. No.: 115,826

[22] Filed: Jan. 28, 1980

[30] Foreign Application Priority Data

Apr. 3, 1979 [GB] United Kingdom ............... 7911672

[51] Int. Cl.³ ................. H04R 17/00; H01J 41/18; H01J 41/22; B29D 7/24
[52] U.S. Cl. ................. 179/110 A; 264/22; 310/324; 427/12; 427/100; 428/208; 428/209
[58] Field of Search ............... 264/22; 427/100, 12; 428/195, 209, 521, 208; 425/174.8 E, 174.8 R; 310/324; 179/110 A, 111 E

[56] References Cited

U.S. PATENT DOCUMENTS

| 3,691,264 | 9/1972 | Asahima | 264/22 |
| 3,878,274 | 4/1975 | Murayama et al. | 264/22 |
| 3,931,446 | 1/1976 | Murayama et al. | 427/100 |
| 3,985,914 | 10/1976 | Sasaki et al. | 427/100 |
| 4,047,998 | 9/1977 | Yoshikawa et al. | 427/100 |
| 4,049,859 | 9/1977 | Yoshikawa et al. | 427/100 |
| 4,127,681 | 11/1978 | Ferren et al. | 264/22 |

FOREIGN PATENT DOCUMENTS 2611047 9/1976 Fed. Rep. of Germany ........ 264/22

Primary Examiner—James B. Lowe

[57] ABSTRACT

A process for making piezo-electric polyvinylidene fluoride (PVDF) film for use, for example, as diaphragms for telephone transmitters, includes the steps of: (a) stretching the melt-extruded film parallel to the extrusion direction with a stretch ratio of about 4 to 1 at about 120° C. to convert it to a β crystalline form; (b) clamping the film between conductive rubber pads to which the polarizing voltage, e.g. 1.3 kv for 12 μm film is applied. While the voltage is thus applied, the film is heated to about 110° C. for 130 mins. and cooled to ambient with the polarizing filed preset; (c) conductive elastomer electrodes are applied to the film in the desired pattern; and (d) the piezo-electric properties are stabilized by heating the foil to about 90° C. for 2 hours.

10 Claims, 1 Drawing Figure

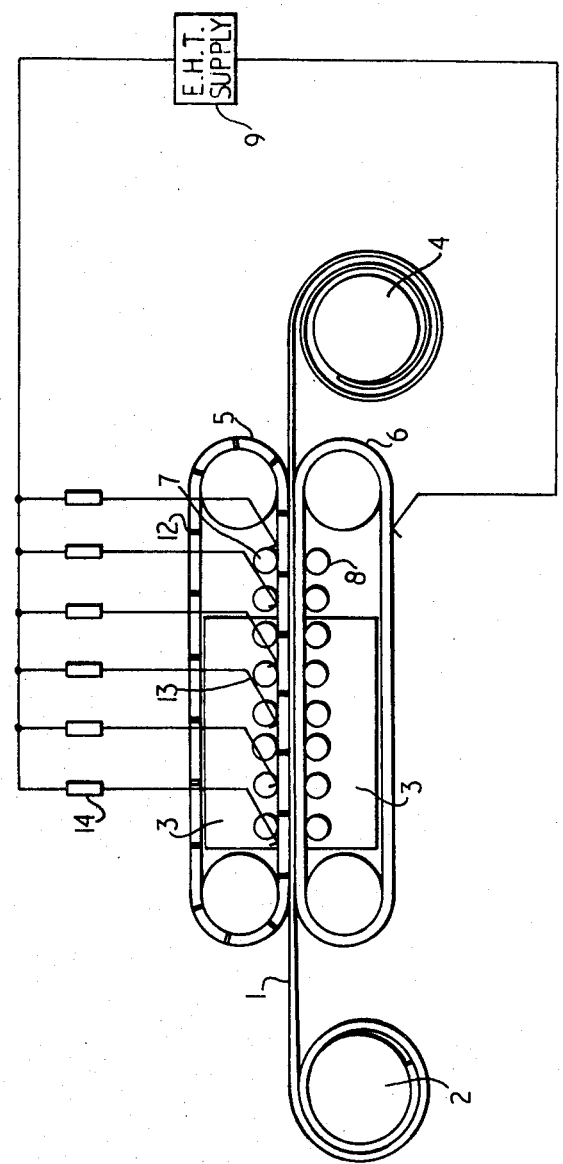

PIEZO-ELECTRIC FILM MANUFACTURE

CROSS REFERENCE TO RELATED APPLICATION

Reference is made to application Ser. No. 110,079, and based upon British application Ser. No. 7,903,224 filed Jan. 30, 1979, filed on even date herewith and assigned to the same assignee of the present invention.

BACKGROUND OF THE INVENTION

The present invention relates to the manufacture of piezo-electrically active plastics film, commencing with the film material in its "raw" state.

One such material which may be used as the active element of an acoustic-electric transducer is polyvinylidene fluoride (PVDF), and the use of such active film materials in such a transducer is described in our British Application No. 7,903,224.

In making the diaphragm for such applications, it is necessary to apply electrodes to the two faces of the film material. This is usually performed by vacuum evaporation, which needs expensive equipment. Further, as the film has to be continuously polarized, the film is usually electroded over a large proportion of its surface area. However, when the material is to be used, e.g. in a transducer, it is often required that only isolated regions have to be electroded. Hence, the metallization has to be partly removed to give the required electrode shape, or the entire electrode must be removed and a new electrode of the required The present invention seeks to overcome the above-mentioned disadvantages.

SUMMARY OF THE INVENTION

According to the present invention, there is provided a process for the production of piezo-electric film, which includes the steps of:
  (a) stretching melt-extruded film of the material to be rendered piezo-electric, which stretching is effected in a direction parallel to the extrusion direction with a stretch ratio and at a temperature such that the material of the film is converted into a form in which it can be rendered piezo-electric;
  (b) clamping the film between layers of conductive rubber or rubber-like material to which is applied a polarizing voltage of a magnitude appropriate to the material to be rendered piezo-electric and to the thickness thereof, the film being held at that temperature for a time appropriate to the production of the desired piezo-electricity, whereafter the film is cooled to room temperature with the polarizing field still applied;
  (c) printing or otherwise forming electrodes of an electrically-conductive elastomer onto the film in the required patterns, and
  (d) stabilizing the piezo-electric properties of the film by heating the film at a temperature intermediate the temperature used in step (b) and the highest temperature to which it is expected that the films will be subjected when in use, wherein the order in which steps (c) and (d) are performed may be reversed.

A process embodying the invention will now be described with reference to the accompanying drawing.

Description of the Preferred Embodiment

In the process described herein, the PVDF film without metallization is clamped between two sheets of silicone rubber which have been made conductive by the addition of carbon particles, and the polarization voltage is applied between these sheets. After polarization, the permanent electrodes are applied over the required areas by screen printing, spraying or brushing, the material thus applied being a thin layer of elastomer containing conductive particles, as in the above-mentioned application. Silicone rubber containing metal particles may also be used for the electrodes, but with such material the maximum polarizing field which can be applied without breakdown of the PVDF film has been found to be lower than with a carbon-containing rubber.

After the stretching process, described hereinafter, the film shrinks when heated. To stabilize its dimensions the film is, in the prior art process, heat-treated at the polarizing temperature or higher while subjected to restraint to prevent any gross change in dimensions. Subsequent heating to a lower temperature during use does not then produce large dimensional changes. We have discovered that by clamping the film between the conductive sheets during polarization, the film is prevented from shrinking; and the separate heat treatment hitherto used may be dispensed with.

In accordance with the process of the present invention, melt-extruded PVDF sheet is stretched uni-axially along the extrusion direction by the natural stretch ratio while the temperature is maintained at less than 120° C. Under these conditions, a large part of the mainly amorphous extruded sheet is converted to the $\beta$ crystalline form, which is suitable to be rendered piezo-electric. At the same time, the thickness of the material is reduced to a value suitable for use as transducer diaphragms. A suitable stretching temperature has been found to be 100° C. with a stretch ratio of 4 to 1. The stretching is preferably performed continuously by winding the film between two rollers driven at different speeds, the take-up roller being the faster rotating one. The speed at which the film leaves the supply roll and the speed at which it is wound onto the take-up roll are monitored, and a control system is used to maintain the required stretch ratio by varying the speed of one of the two drive motors. The region over which the stretching takes place is heated to the required stretch temperature.

The continuous polarizing process will now be described, with reference to the accompanying drawing.

The film 1 to be treated is passed from a supply reel 2 through a slot and into a chamber 3, which it leaves via another slot and is wound onto a take-up reel 4. The chamber 3 is heated to the polarization temperature, which is 110° C. in the present example. During its passage through the chamber 3, as well as before entering and after leaving the chamber 3, the film is clamped between two endless belts 5 and 6, which run over a series of rollers, such as 7, 8.

One of the belts 6 has on its surface a continuous layer of silicone rubber containing carbon particles to render it electrically conductive, and this layer is connected to one terminal of an EHT supply 9. The other belt 5 also has electrically conductive silicone rubber on its surface, but this is applied in electrically isolated regions with an insulative strip such as 12 or a gap a few millimetres wide between each such region. Note here that a gap between the edges of two adjacent silicone rubber regions is, in effect, an electrically insulative gap.

By a series of slidable contacts such as 13 on the edge, or on the inner surface of the belt, each region of conductive rubber is connected via a resistor such as 14 to the EHT supply 9. This arrangement of separate regions of conductive rubber effectively connected to the source 9 via resistors means that if a defect in the film being treated causes the belts to be short-circuited, only the region of the film covered by the section involved fails to be polarized. Hence, the whole length of film between the two belts is not wasted. By keeping the inter-region gaps as small as possible, only a little of the film is not completely polarized; and because of the fringing field at the edge of the sheet, the loss of activity is small.

The polarization voltage used should be as large as possible to obtain the maximum piezo-electric effect. The electric field is, however, limited by the dielectric strength of the film to about $10^8$ volts/meter at a polarizing temperature of 110° C. for a 12 $\mu$m film, this means a polarizing voltage of about 1300 volts. The piezo-electric constants increase with polarization time up to a limiting value: in the case of the temperature and field strengths used in the present example, very little improvement in piezo-electric properties is achievable after a polarization time of about 30 mins. Hence, the length of the polarization chamber 3 and the speed of travel of the film are such that the film remains in the polarizing field for at least 30 mins.

After it leaves the heated chamber 3, the film is cooled to 50° C. or lower before the polarizing film is removed. This can be seen to be so in the drawing, because of the electrodes 13 which are shown to the right of the exit slot of the chamber 3. The rate of cooling is not important; but to reduce the lengths of the continuous belts needed if natural cooling is used, the final clamping rollers may be water cooled. The film may now be wound onto the take-up reel 4, or may pass directly to the stabilization heating stage.

This next stage involves heating the film without constraints to stabilize its piezo-electric and mechanical properties. This final heating must be effected at a temperature below the polarization temperature but above any temperature which the material is expected to experience during its subsequent use. Thus, if the maximum temperature to which a transducer housing a diaphragm of this film is expected to be subjected is 70° C., it has been found that subsequent change of sensibility is negligible if the film is stabilized at a temperature of 90° C. for 2 hours, after polarization at 110° C. This is achieved by simply passing the film through a heated chamber while allowing some slack within the chamber, so that the material may relax. Thus, the polarizing temperature of 110° C. is so chosen to achieve a suitable margin above the operation and heat treatment temperatures.

Electrodes of conductive elastomer can now be applied by, for example, screen printing to give the patterns required before or subsequent to punching or cutting the required areas from the films, as described, for example, in the above-mentioned Application No. 7,903,224.

Certain variations to the process described above may be made. Thus, two or more of the operation for stretching, polarizing, stabilization and electroding can be linked together without winding the films onto reels between stages. Further, the use of the polarization method wherein conductive elastomer sheets (the two belts in the drawing) are used as temporary electrodes is not limited to continuous polarization; but may also be applied as a batch process. Again, a sandwich of alternate layers of PVDF and conductive rubber may be made in an oven; and polarization may be effected by connecting alternate ones of the rubber layers via resistors to the terminals of an EHT supply and heating for the required time. The material is then allowed to cool before removing the polarizing field.

While the present invention has been described in connection with a preferred embodiment thereof, it is to be understood that additional embodiments, modifications and applications which will become obvious to those skilled in the art are included within the spirit and scope of the invention as set forth by the claims appended hereto.

I claim:

1. A process for the production of piezo-electric film, which includes the steps of:
   (a) stretching melt-extruded film of the material to be rendered piezo-electric, which stretching is effected in a direction parallel to the extrusion direction with a stretch ratio and at a temperature such that the material of the film is converted into a form which it can be rendered piezo-electric;
   (b) clamping the film between layers of conductive rubber or rubber-like material to which is applied a polarizing voltage of a magnitude appropriate to the material to be rendered piezo-electric and to the thickness thereof, the film being held at that temperature for a time appropriate to the production of the desired piezo-electricity, whereafter the film is cooled to room temperature with the polarizing field still applied;
   (c) printing or otherwise forming electrodes of an electrically-conductive elastomer onto the film in the required patterns; and
   (d) stabilizing the piezo-electric properties of the film by heating the film at a temperature intermediate the temperature used in step (b) and the highest temperature to which it is expected that the film will be subjected when in use, wherein the order in which steps (c) and (d) are performed may be reversed.

2. A process for the production of piezo-electric PVDF film, which includes the steps of:
   (a) stretching melt-extruded PVDF film, which stretching is effected in a direction parallel to the extrusion direction, with a stretch ratio of the order of 4 to 1 and at a temperature of 100° to 140° C. to convert the sheet into the $\beta$ crystalline form;
   (b) clamping the film between conductive rubber layers to which is applied a polarizing voltage of about $10^8$ volts per meter in the case of a 12 $\mu$m thick material, the film being held at a temperature of about 110° C. for 30 mins., whereafter the film is cooled to room temperature with the polarizing field still applied;
   (c) printing or otherwise forming electrodes of an electrically-conductive elastomer onto the film in the required pattern; and
   (d) stabilizing the piezo-electric properties by heating the film at about 90° C. for two hours, wherein the order in which steps (c) and (d) are performed may be reversed.

3. A process as claimed in claims 1 or 2; and in which the polarization effected in step (b) is made continuous by passing the sheet material between two endless belts having pads of electrically-conductive material on their surfaces, which pads are separated by insulative regions.

4. A process as claimed in claims 1 or 2; and in which the polarization effected in step (c) is effected by setting up a sandwich of layers of conductive rubber with one or more layers of the film to be rendered piezo-electric, and connecting alternate ones of the conductive rubber layers of the two terminals of a supply source.

5. A process as claimed in claim 4, and in which said conductive rubber is a silicone rubber.

6. Diaphragms of piezo-electric film for use in electro-acoustic transducers, made by the process of claim 1.

7. Diaphragms of piezo-electric film for use in electro-acoustic transducers, made by the process of claim 2.

8. Diaphragms of piezo-electric film for use in electro-acoustic transducers, made by the process of claim 3.

9. Diaphragms of piezo-electric film for use in electro-acoustic transducers, made by the process of claim 4.

10. Diaphragms of piezo-electric film for use in electro-acoustic transducers, made by the process of claim 5.

* * * * *

UNITED STATES PATENT AND TRADEMARK OFFICE
CERTIFICATE OF CORRECTION

PATENT NO. : 4,340,786
DATED : July 20, 1982
INVENTOR(S) : Norman W. Tester

It is certified that error appears in the above—identified patent and that said Letters Patent is hereby corrected as shown below:

Title page, left-hand column, insert between items [76] and [21]:

--[73] Assignee: International Standard Electric Corporation --

Title page, right-hand column, insert between "*Primary Examiner - James B. Lowe*" and "[57]":

--*Attorney, Agent, or Firm* - John T. O'Halloran; Jeffrey P. Morris --

Signed and Sealed this

Twenty-eighth Day of December 1982

[SEAL]

Attest:

GERALD J. MOSSINGHOFF

Attesting Officer

Commissioner of Patents and Trademarks